(12) United States Patent
Habusha et al.

(10) Patent No.: US 10,061,700 B1
(45) Date of Patent: Aug. 28, 2018

(54) SYSTEM AND METHOD FOR MANAGING TRANSACTIONS

(71) Applicant: Amazon Technologies, Inc., Seattle, WA (US)

(72) Inventors: Adi Habusha, Moshav Alonei Abba (IL); Gil Stoler, Nofit (IL); Said Bshara, Tira (IL); Nafea Bshara, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 28 days.

(21) Appl. No.: 15/230,230

(22) Filed: Aug. 5, 2016

Related U.S. Application Data

(60) Continuation of application No. 14/829,410, filed on Aug. 18, 2015, now Pat. No. 9,411,731, which is a division of application No. 13/682,781, filed on Nov. 21, 2012, now Pat. No. 9,141,546.

(51) Int. Cl.
*G06F 12/08* (2016.01)
*G06F 12/0817* (2016.01)
*G06F 12/0855* (2016.01)

(52) U.S. Cl.
CPC ...... *G06F 12/0828* (2013.01); *G06F 12/0855* (2013.01); *G06F 2212/621* (2013.01)

(58) Field of Classification Search
CPC ........... G06F 2212/621; G06F 12/0828; G06F 12/0855
USPC ....................................................... 711/141
See application file for complete search history.

(56) References Cited

U.S. PATENT DOCUMENTS

| | | | |
|---|---|---|---|
| 6,535,958 B1 | 3/2003 | Fuoco et al. | |
| 8,041,897 B2 | 10/2011 | Biles et al. | |
| 9,141,546 B2 | 9/2015 | Habusha et al. | |
| 9,411,731 B2 | 8/2016 | Habusha et al. | |
| 2007/0079075 A1* | 4/2007 | Collier | G06F 12/082 711/141 |
| 2007/0294481 A1 | 12/2007 | Hoover et al. | |
| 2012/0290752 A1* | 11/2012 | Lim | G06F 13/4022 710/110 |

OTHER PUBLICATIONS

U.S. Appl. No. 13/682,781, "Non-Final Office Action", dated Dec. 12, 2014, 9 pages.

(Continued)

*Primary Examiner* — Jasmine Song
(74) *Attorney, Agent, or Firm* — Kilpatrick Townsend & Stockton LLP

(57) ABSTRACT

A method for writing data, the method may include: receiving or generating, by an interfacing module, a data unit coherent write request for performing a coherent write operation of a data unit to a first address; receiving, by the interfacing module and from a circuit that comprises a cache and a cache controller, a cache coherency indicator that indicates that a most updated version of the content stored at the first address is stored in the cache; and instructing, by the interfacing module, the cache controller to invalidate a cache line of the cache that stored the most updated version of the first address without sending the most updated version of the content stored at the first address from the cache to a memory module that differs from the cache if a length of the data unit equals a length of the cache line.

19 Claims, 4 Drawing Sheets

(56) References Cited

OTHER PUBLICATIONS

U.S. Appl. No. 13/682,781 , "Notice of Allowance", dated May 29, 2015, 8 pages.
U.S. Appl. No. 14/829,410 , "Non-Final Office Action", dated Nov. 23, 2015, 13 pages.
U.S. Appl. No. 14/829,410 , "Notice of Allowance", dated Apr. 5, 2016, 5 pages.

\* cited by examiner

SYSTEM AND METHOD FOR MANAGING TRANSACTIONS

CROSS REFERENCE TO RELATED APPLICATIONS

This application is a continuation of U.S. patent application Ser. No. 14/829,410, filed Aug. 18, 2015, issued as U.S. Letters Pat. No. 9,411,731 on Aug. 9, 2016, titled "SYSTEM AND METHOD FOR MANAGING TRANSACTIONS", which is a divisional of U.S. patent application Ser. No. 13/682,781, filed Nov. 21, 2012, issued as U.S. Letters Pat. No. 9,141,546 on Sep. 22, 2015, titled "SYSTEM AND METHOD FOR MANAGING TRANSACTIONS" the entireties of which are incorporated herein by reference.

BACKGROUND OF THE INVENTION

A memory system is coherent if the value read by a data read or instruction fetch is always the value that was most recently written to that location. Memory coherency is difficult when the memory system includes multiple possible physical locations, such as main memory and at least one of a write buffer or one or more caches (ARM glossary, www.arm.com).

There are various prior art cache coherent interconnect that provide full cache coherency between clusters of multi-core processors (CPUs) and input/output (I/O) coherency for devices such as I/O masters and the like.

Various system on chip architectures are tailored to applications such as mobile applications (especially smart phones) where the throughout and bandwidth are relatively small.

Such architectures may have various drawbacks. Some of these drawbacks include:
a. A cache coherent interconnect may be connected to a dynamic random access memory (DRAM) module. Accessing to the DRAM module is time consuming and the ARM architecture is characterized by inefficient DRAM accesses.
b. A cache coherent interconnect may prevent pipelining of transactions requests that have a same transaction identifier. Thus, when multiple transaction requests that have a same transaction identifier are received by the cache coherent interconnect—the cache coherent interconnect will service only one transaction request at a time—and this can introduce vary large delays.
c. Write operations of portions of a cache line require multiple DRAM read and write operations.

There is a growing need to provide method and systems for enhancing the capability of interconnects

SUMMARY

According to various embodiments of the invention various methods may be provided, some are listed below and/or claimed in the claims.

Additional embodiments of the invention include a system arranged to execute any or all of the methods described above, including any stages—and any combinations of same. Some of the systems are listed below and/or claimed in the claims.

Any reference to a method should be interpreted as referring to a system capable of executing the method. Any reference to a system should be interpreted as referring to a method that can be executed by the system.

There may be provided a method for writing data, the method may include: receiving or generating, by an interfacing module, a data unit coherent write request for performing a coherent write operation of a data unit to a first address; receiving, by the interfacing module and from a circuit that may include a cache and a cache controller, a cache coherency indicator that indicates that a most updated version of the content stored at the first address is stored in the cache; and instructing, by the interfacing module, the cache controller to invalidate a cache line of the cache that stored the most updated version of the first address without sending the most updated version of the content stored at the first address from the cache to a memory module that differs from the cache if a length of the data unit equals a length of the cache line.

The method may include instructing the cache controller to send the content of the first address from the cache to the memory module and to invalidate the cache line of the cache that stored the most updated version of the first address if the length of the data unit equals a portion of a length of the cache line.

The method may include receiving by the interfacing module the data unit coherent write request.

The method may include generating by the interfacing module the data unit coherent write request.

The method may include: receiving a data chunk coherent write request for performing a coherent write operation of a data chunk of a length that exceeds the length of the cache line; and converting the data chunk coherent write request to multiple data unit coherent write requests.

The method may include performing, by an interconnect that is coupled between the cache controller and the interfacing module, a snoop transaction that involves invalidating the cache line of the cache that stored the most updated version of the content stored at the first address without sending the most updated version of the content stored at the first address from the cache to the memory module.

There may be provided a method for writing data, the method may include: receiving or generating, by an interfacing module, a data unit coherent write request for performing a coherent write operation of a data unit; receiving, by the interfacing module and from a circuit that may include a cache controller and a cache, a cache coherency indicator that indicates that a most updated version of the data unit is stored in the cache; and instructing, by the interfacing module, the processor to send the most updated version of the content stored at the first address from the cache to hierarchy memory module that differs from the cache and to invalidate a cache line of the cache that stored the most updated version of the content stored at the first address if a length of the data unit equals a portion of a length of the cache line.

The method may include instructing, by the interfacing module, the cache controller to invalidate the cache line of the cache that stored the most updated version of the content stored at the first address without sending the most updated version of the content stored at the first address from the cache to the memory module if the length of the data unit equals the length of the cache line.

The method may include receiving by the interfacing module the data unit coherent write request.

The method may include generating by the interfacing module the data unit coherent write request.

The method may include: receiving a data chunk coherent write request for performing a coherent write operation of a data chunk of a length that exceeds the length of the cache line; and converting the data chunk coherent write request to multiple data unit coherent write requests.

There may be provided a method for performing a transaction, the method may include: receiving, by an interfacing module, multiple transaction requests related to multiple data units; wherein the multiple transaction requests are associated with transaction identifiers of a same value; generating modified transaction requests by replacing the transaction identifiers with new transaction identifiers; wherein different modified transaction requests are associated with new transaction identifiers that have different values; and sending, by the interfacing entity, the modified transaction requests to an interconnect; wherein the interconnect may be arranged to prevent pipelining of transaction requests that have new transaction identifiers of a same value; receiving transaction responses to the modified transactions requests; and responding to the transaction responses while maintaining an order of arrival of the multiple transaction requests.

The multiple transaction requests are read requests, wherein the modified transaction requests are modified read requests, wherein the transaction responses may include data units read from modules coupled to the interfacing module; wherein the responding may include outputting the data units according to an order of arrival of the multiple read requests.

The multiple transaction requests are write requests, wherein the modified transaction requests are modified write requests; wherein the writes may include participating in writing to either one of a cache of a processor and a dynamic random access memory (DRAM) module coupled to the interconnect data units, and the write transactions responses associated with the multiple write requests returned according to an order of arrival of the multiple write requests.

The method may include generating, by the interconnect, multiple snoop transactions that are associated with the new transaction identifiers; receiving by the interconnect multiple snoop responses to the snoop transaction; wherein each snoop response indicates whether a transaction request should be targeted to the cache controller or to hierarchy memory module that differs from the cache and is coupled to the interconnect.

There may be provided a system that may include an interfacing module that may include: an input output (I/O) circuit; and a transaction request processor that is coupled to the I/O circuit; wherein the I/O circuit may be arranged to: receive a data unit coherent write request for performing a coherent write operation of a data unit; and receive a cache coherency indicator that indicates that a most updated version of the data unit is stored in a cache of a processor; and wherein the transaction request processor may be arranged to receive the data unit coherent write request and the cache coherency indicator and to instruct the processor to invalidate a cache line of the cache that stored the most updated version of the content stored at the first address without sending the most updated version of the content stored at the first address from the cache to a memory module that differs from the cache if a length of the data unit equals a length of the cache line.

The system may include an interconnect that is coupled between the processor and the interfacing module.

The interconnect may be arranged to perform a snoop transaction that involves invalidating the cache line of the cache that stored the most updated version of the content stored at the first address without sending the most updated version of the content stored at the first address from the cache to the memory module.

The system may include a write compressor and a memory controller; wherein the memory controller is coupled to the memory module via a memory bus that is narrower than a width of an interconnect bus; wherein the write compressor is coupled between the interconnect bus and the memory controller; wherein the write compressor may be arranged to: receive an information entity that may include irrelevant bits and data, the data having a data length that does not exceed a width of the memory bus, and remove at least some of the irrelevant bits to provide a modified information entity that may include the data and zero or more irrelevant bits.

The interfacing module may be arranged to instruct the processor to send the most updated version of the content stored at the first address from the cache to the memory module and to invalidate the cache line of the cache that stored the most updated version of the content stored at the first address if the length of the data unit equals a portion of the length of the cache line.

There may be provided a system that may include an interfacing module that may include an input output (I/O) circuit and a transaction request processor that is coupled to the I/O circuit; wherein the I/O circuit may be arranged to: receive a data unit coherent write request for performing a coherent write operation of a data unit; and receive a cache coherency indicator that indicates that a most updated version of the data unit is stored in a cache of a processor; and wherein the transaction request processor may be arranged to receive the data unit coherent write request and the cache coherency indicator from the I/O circuit and to instruct the processor to send the most updated version of the content stored at the first address from the cache to a memory module that differs from the cache and to invalidate a cache line of the cache that stored the most updated version of the content stored at the first address if a length of the data unit equals a portion of a length of the cache line.

The interfacing module may be arranged to instruct the processor to invalidate the cache line of the cache that stored the most updated version of the content stored at the first address without sending the most updated version of the content stored at the first address from the cache to the DRAM module if the length of the data unit equals the length of the cache line.

There may be provided a system may include a memory module, a memory controller, a cache controller and an interconnect that is coupled to the memory module and the memory controller; wherein the interfacing module may be arranged to issue a read snoop command of a certain address to the cache controller; wherein the cache controller may be arranged, if there is a cache hit and the certain address is marked as an address associated with a single producer and single consumer, to either invalidate a cache line that is located at the certain address or mark that cache line as clean.

The cache controller or the interconnect are arranged to access a list of addresses that are marked as addresses that are associated with a single producer and single consumer to determine whether the certain address is marked as an address associated with a single producer and single consumer.

The read snoop command may include an indication of whether the certain address is marked as an address associated with a single producer and single consumer.

The cache memory controller may be arranged to either invalidate the cache line that is located at the certain address or mark that cache line as clean only if the read snoop command is associated with reading an entire cache line, there is a cache hit and the certain address is marked as an address associated with a single producer and single consumer.

The cache memory controller may be arranged to be prevented from invalidate the cache line that is located at the certain address or mark that cache line as clean if the read snoop command is associated with reading only a portion of a cache line, even if there is a cache hit and the certain address is marked as an address associated with a single producer and single consumer.

There may be provided a system that may include an interfacing module that may include an input output (I/O) circuit and a transaction request processor that is coupled to the I/O circuit; wherein the I/O circuit may be arranged to receive multiple transaction requests related to multiple data units; wherein the multiple transaction requests are associated with transaction identifiers of a same value; wherein the transaction request processor may be arranged to: receive from the I/O circuit the multiple transaction requests; generate modified transaction requests by replacing the transaction identifiers with new transaction identifiers; wherein different modified transaction requests are associated with new transaction identifiers that have different values; and wherein the I/O circuit is further arranged to: send the modified transaction requests to an interconnect that is coupled to a processor; wherein the interconnect may be arranged to prevent pipelining of transaction requests that have new transaction identifiers of a same value; and receive transaction response to the modified transactions requests; and wherein the transaction request processor is further arranged to respond to the transaction responses while maintaining an order of arrival of the multiple transaction requests.

There may be provided a system that may include a cache controller for controlling a cache, a memory module that differs from the cache, a write compressor, a memory controller for controlling the memory module, and an interconnect; wherein the memory controller is coupled to the memory module via a memory bus that is narrower than a width of an interconnect bus; wherein the write compressor is coupled between the interconnect bus and the memory controller; wherein the write compressor is arranged to: receive an information entity that comprises irrelevant bits and data, the data having a data length that does not exceed a width of the memory bus, and remove at least some of the irrelevant bits to provide a modified information entity that comprises the data and zero or more irrelevant bits.

There may be provided a method that may include issuing, by an interfacing module a read snoop command of a certain address to a cache controller; determining if there is a cache hit and the certain address is marked as an address associated with a single producer and single consumer; and either invalidating a cache line that is located at the certain address or marking that cache line as clean if it is determined that there is a cache hit and the certain address is marked as an address associated with a single producer and single consumer.

The method may be executed by a system that includes a memory module, a memory controller, a cache controller and an interconnect that is coupled to the memory module and the memory controller.

There may be provided a method that may include receiving by a write compressor an information entity that comprises irrelevant bits and data, the data having a data length that does not exceed a width of a memory bus; and removing at least some of the irrelevant bits to provide a modified information entity that comprises the data and zero or more irrelevant bits; wherein the memory bus couples between the memory controller to a memory module that differs from a cache; wherein the memory bus is narrower than an interconnect bus; wherein the write compressor is coupled between the interconnect bus and the memory controller.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
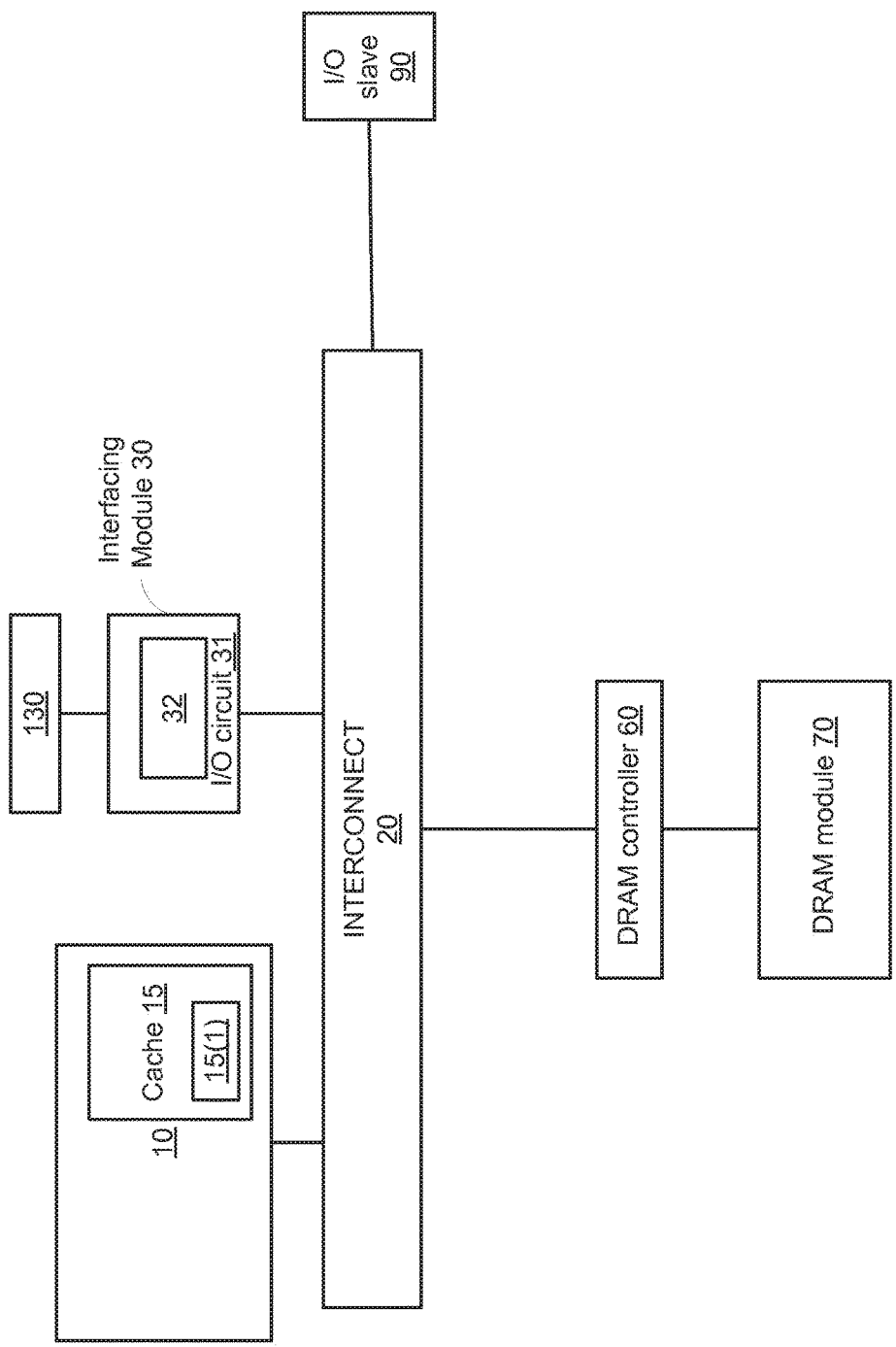
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details may be set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repealed among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The following description refers to a DRAM memory although it can be applicable, according to various embodiments of the invention, to other types of memory modules.

Reducing Cache to DRAM Write Operations

FIG. 1 illustrates a system 100 according to an embodiment of the invention.

System 100 may be a system on chip (SOC), may include an SOC, may be part of a SOC, may include one or more semiconductors dies, and the like.

System 100 includes processor 10, input/output (I/O) master 130, interfacing module 30, interconnect 20, dynamic random access memory (DRAM) controller 60, DRAM module 70 and I/O slave 90. Processor 10 includes a cache 15. Cache 15 includes multiple cache lines such us cache line 15(1).

The interconnect 20 is connected to the processor 10, the interfacing module 30, the I/O slave 90 and the DRAM controller 60. The DRAM controller 60 is also connected to the DRAM module 70.

The DRAM module 70 can have a cacheable memory space and this cacheable memory space can be a portion of the DRAM module 70 or the entire DRAM module 70. The cacheable memory space should store (at certain points of time) the same content as the cache 15. The cacheable memory space and the cache 15 may be addressed by the same addresses.

The interconnect 20 may be a corelink CCI-400 cache coherent interconnect or may by any other cache coherent interconnect that preserves the memory coherency. The memory coherency may be preserved by performing snoop transactions that assist in determining where the most updated version of a data unit is stored (in the DRAM module 70 or in cache 15).

The interfacing module 30 includes an I/O circuit 31 and a transaction request processor 32 that is coupled to the I/O circuit 31.

The I/O circuit 31 may be arranged to (a) receive a data unit coherent write request for performing a coherent write operation of a data unit; and (b) receive a cache coherency indicator that indicates that a most updated version of the data unit is stored in a cache of a processor.

The transaction request processor 32 may be arranged to receive the data unit coherent write request and the cache coherency indicator and to instruct the processor 10 (or provide the data unit coherent write request to the interconnect 20 that in turn instructs the processor 10) to invalidate a cache line of the cache that stored the most updated version of the data unit without sending the most updated version of the content stored at the first address from the cache 15 to the DRAM module 70 if a length of the data unit equals a length of the cache line. This most updated version of the content stored at the first address is older than the currently received data unit.

The interconnect 20 may be arranged to perform, in response to a reception of the data unit coherent write request, a snoop transaction that involves invalidating the cache line of the cache 15 that stored the most updated version of the content stored at the first address without sending the most updated version of the content stored at the first address from the cache to the DRAM module.

The interfacing module 30 may be arranged to receive the data unit coherent write request and the cache coherency indicator from the I/O circuit and to instruct the processor to send the most updated version of the content stored at the first address from the cache 15 to the DRAM module 70 and to invalidate a cache line of the cache 15 that stored the most updated version of the content stored at the first address if a length of the data unit equals a portion of a length of the cache line.

Pipelining Transaction Requests

According to another embodiment of the invention the interfacing module is arranged to speed up the processing of transaction requests by bypassing the interconnect anti-pipelining mechanism that prevents pipelining of transaction requests that share the same transaction identifier.

The I/O circuit 31 of the interfacing unit 30 may be arranged to receive multiple transaction requests related to multiple data units. If the transaction identifiers of these multiple transaction requests differ from each other then they can be sent to the interconnect. The interconnect 20 may pipeline these transaction requests.

If, for example, the multiple transaction requests are associated with transaction identifiers of a same value then the transaction request processor 32 may be arranged to:
a. Receive from the I/O circuit 31 the multiple transaction requests.
b. Generate modified transaction requests by replacing the transaction identifiers with new transaction identifiers; wherein different modified transaction requests are associated with new transaction identifiers that have different values.
c. Send the modified transaction identifiers to the I/O circuit than in turn sends the modified transaction requests to an interconnect that is coupled to a processor; wherein the interconnect is arranged to prevent pipelining of transaction requests that have new transaction identifiers or a same value.
d. Receive from the I/O circuit 31 transaction responses to the modified transactions requests.
e. Respond to the transaction responses while maintaining an order of arrival of the multiple transaction requests.

Figure 2:
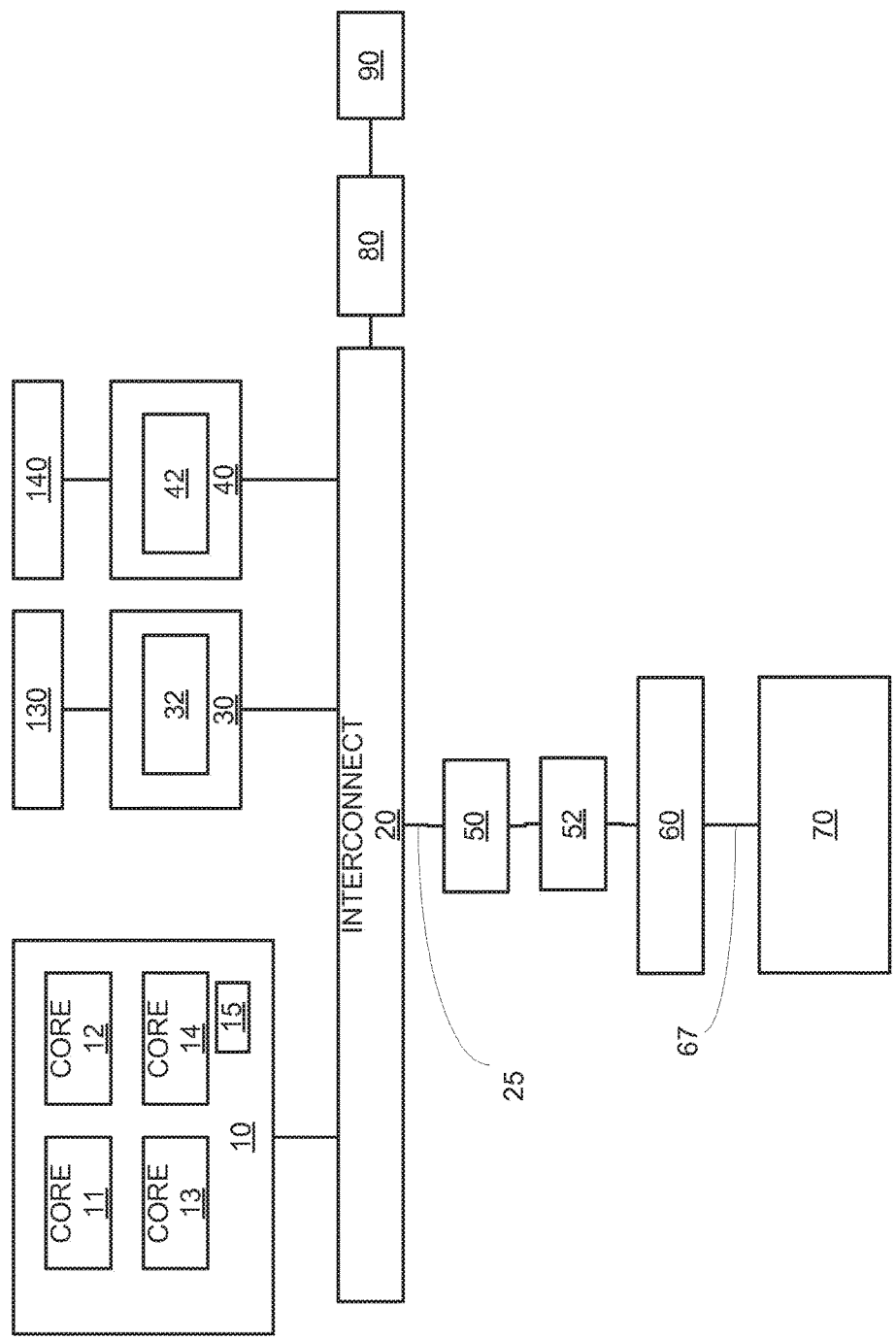
FIG. 2 illustrates a system according to an embodiment of the invention.

FIG. 2 illustrates a system 101 according to another embodiment of the invention.

System 101 differs from system 100 of FIG. 1 by:
a. Including three interfacing modules (30, 40 and 80) instead of a single interfacing module (30).
b. Having a pair of I/O masters (130 and 140) instead of a single I/O master (130).
c. Having a write compressor 50 that is coupled between the interconnect 20 and the DRAM controller 60.
d. Having a processor 10 that includes four cores 11-14 and cache 15.
e. Having a bridge 52 (such as an ACI bridge) between the interconnect 20 and the write compressor 50.

Interfacing module 30 may be equal to the interfacing module 40.

Interfacing module 80 can speed up the interaction between the processor 10 and external modules by:
a. Receiving a transaction request from the processor 10 that is aimed to an external module (an external module such as a register outside system 101).
b. Sending the transaction request to the external module.
c. Providing an acknowledgement to the processor 10 that releases the processor 10 from waiting to a response from the external module—before the external module provides such an acknowledgement.
d. The provision of the acknowledgement and, additionally or alternatively, the sending of the transaction request to the external module may include maintaining a coherency between read and write transactions addressed to the same external module (or—if the external module has multiple addresses—to the same address)—by delaying a response to a read request before a completion of a write request destined to the same address.
e. The provision of the acknowledgement and, additionally or alternatively, the sending of the transaction request to the external module may include delaying the sending of the request to the external module if the transaction request is of a type that requires that a previous transaction request sent to the same external module will be responded by the external module before the interfacing module may send the transaction request to the external module. Alternatively—the provision of the acknowledgement and, additionally or alternatively, the sending of the transaction request to the external module may include delaying the sending of the request to the external module if the transaction request is of a type that requires that a predetermined period will lapse from the sending of the previous transaction request to the same external module—so that the external module is expected to be ready to respond to the delayed transaction request. This can be applicable, for example, in AXI protocol device type of transaction requests. It is noted that the delayed transaction request and the previous transaction request can be aimed to different addresses (for example—they can be associated with a read pointer and a write pointer of a buffer).

The DRAM controller 60 may be coupled to the DRAM module 70 via a DRAM bus 67 that is narrower than a width of an interconnect bus 25 between the interconnect 20 and the write compressor 50.

The write compressor 50 can assist in reducing the amount of transactions between the DRAM controller 60 and the DRAM module 70 by removing irrelevant bits such as padding bits that may be added to a data unit in order to provide an information entity that has a width of the interconnect bus 25.

The write compressor 50 may be arranged to receive an information entity that comprises irrelevant bits and data, the data having a data length that does not exceed a width of the DRAM bus, and remove at least some of the irrelevant bits to provide a modified information entity that comprises the data and zero or more irrelevant bits.

According to an embodiment of the invention the DRAM controller 60 is arranged to receive from the interconnect a cache line wide information unit and is arranged to perform an error correction coding (ECC) process on all of the cache line bits—if at least some of the bits are flagged as being valid. The ECC process can be applied on the entire information unit but is usually applied on information sub-units. For example, the information unit can be 64 bytes long, and the ECC process is applied on information sub-units of 16 bytes long. The write compressor 50 can receive an information unit that is 64 bytes long and that includes a single valid information sub-unit and three invalid information sub-units. It is noted that information units and sub-units of different lengths and different ratios can be compressed or outputted by the write compressor 50.

The write compressor 50 can send only the single valid sub-unit to the DRAM controller 60 and the DRAM controller 60 will perform the ECC process only on that single valid sub-unit und perform only a single ECC process instead of four ECC processes. FIG. 2 illustrates the write compressor 50 that receives an information unit that includes four information sub-units 201(1)-201(4) of which only 201(2) is valid, wherein the write compressor 50 outputs only the valid information sub-unit 201(2).

Figure 3:
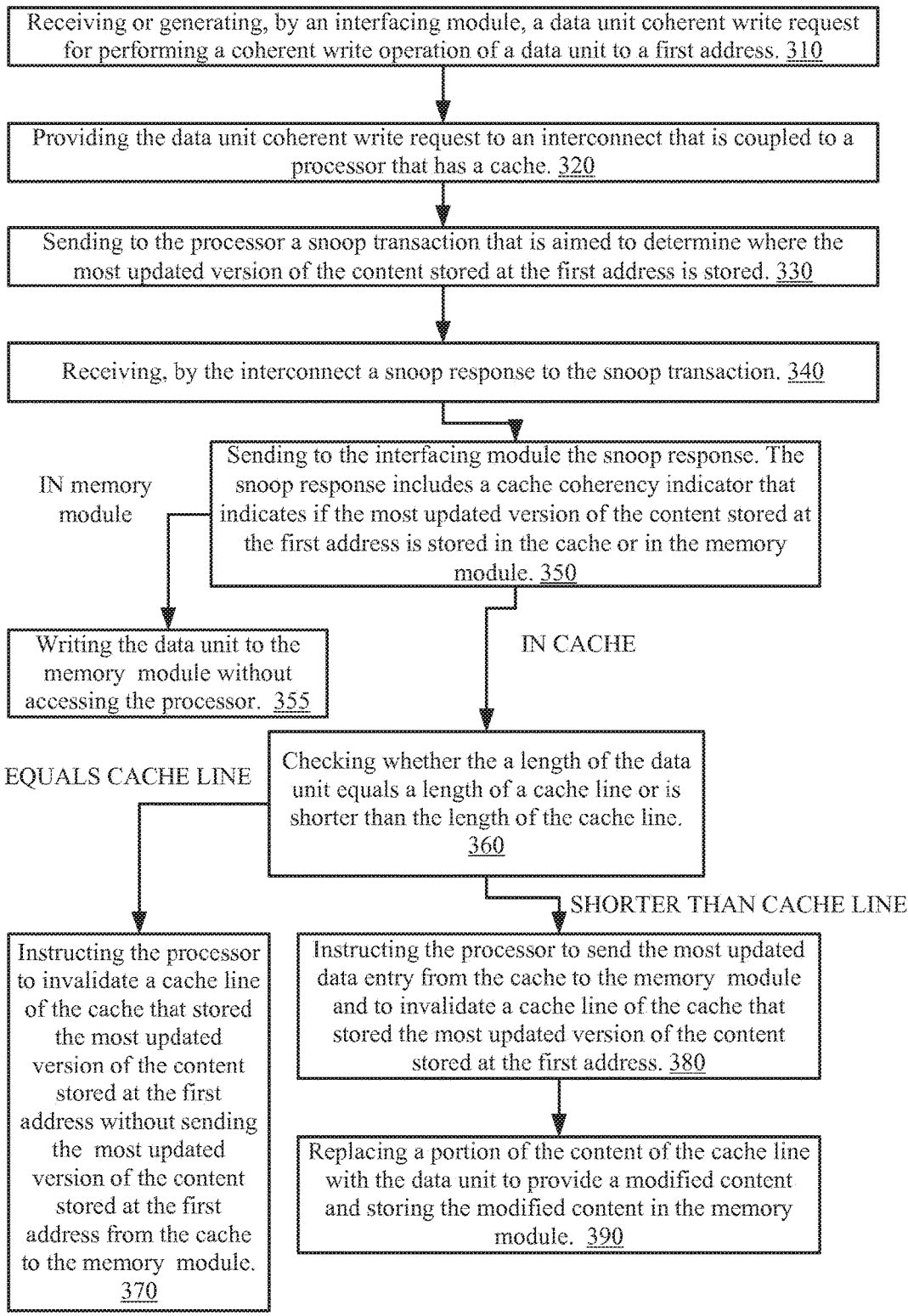
FIG. 3 illustrates a method according to an embodiment of the invention.

FIG. 3 illustrates method 300 for writing data according to an embodiment of the invention.

Method 300 may start by stage 310 of receiving or generating, by an interfacing module, a data unit coherent write request for performing a coherent write operation of a data unit to a first address. The first address can be a virtual addressor a physical address. It can be any address within the cache or a cacheable space of the DRAM module.

Stage 310 is followed by stage 320 of providing the data unit coherent write request to an interconnect that is coupled to a processor that has a cache.

Stage 320 may be followed by stage 330 of sending to the processor a snoop transaction that is aimed to determine where the most updated version of the data unit (before the received data unit) is stored.

Stage 330 may be followed by stage 340 of receiving, by the interconnect a snoop response to the snoop transaction.

Stage 340 may be followed by stage 350 of sending to the interfacing module the snoop response. The snoop response includes a cache coherency indicator that indicates if the most updated version of the data unit is stored in the cache or in the DRAM module.

If the cache coherency indicator indicates that the most updated version of the data unit is stored in the DRAM module then stage 350 is followed by stage 355 of writing the data unit to the DRAM module 70 without accessing the processor 10.

If the cache coherency indicator indicates that the most updated version of the data unit is stored in the cache then stage 350 is followed by stage 360 of checking whether the a length of the data unit equals a length of a cache line or is shorter than the length of the cache line.

If it is determined that the length of the data unit equals a length of the cache line then stage 360 is followed by stage 370 of instructing, by the interfacing module, the processor to invalidate a cache line of the cache that stored the most updated version of the content stored at the first address without sending the most updated version of the content stored at the first address from the cache to the DRAM module.

If it is determined that the length of the data unit equals a portion of the length of the cache line then stage 360 is followed by stage 380 of instructing the processor to send the most updated version of the content stored at the first address from the cache to the DRAM module and to invalidate a cache line of the cache that stored the most updated version of the data unit.

Stage 380 may be followed by stage 390 of replacing a portion of the content of the cache line with the data unit to provide a modified content and storing the modified content in the DRAM module.

It is noted that stages 310-390 may operate on write requests that refer to data units of a length that does not exceed a length of a cache line. Under this scenario write requests (such as data chunk coherent write requests) that relate to data units to data chunks that are longer than a single cache line are replaced by multiple data unit coherent write requests). Thus, stage 310 may include receiving a data chunk coherent write request for performing a coherent write operation of a data chunk of a length that exceeds the length of the cache line; and converting the data chunk coherent write request to multiple data unit coherent write requests.

Figure 4:
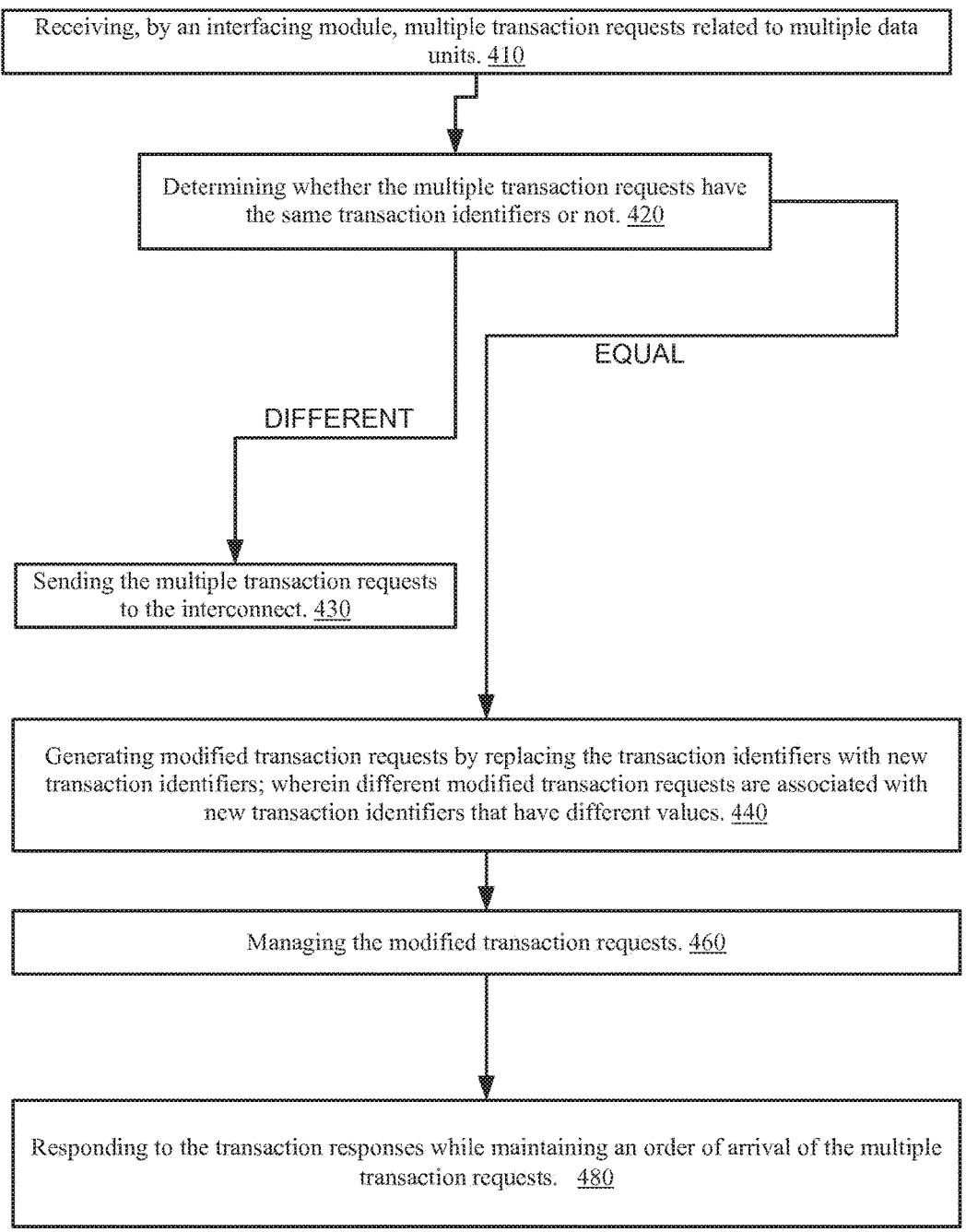
FIG. 4 illustrates a method according to an embodiment of the invention.

FIG. 4 illustrates method 400 for performing a transaction according to an embodiment of the invention.

Method 400 may start by stage 410 of receiving, by an interfacing module, multiple transaction requests related to multiple data units.

Stage 410 may be followed 420 of determining whether the multiple transaction requests have the same transaction identifiers or not.

If it is determined that the multiple transaction requests are associated with different transaction identifiers then stage 420 is followed by stage 430 of sending the multiple transaction requests to the interconnect.

If it is determined that the multiple transaction requests are associated with transaction identifiers of a same value then stage 420 is followed by stage 440 of generating modified transaction requests by replacing the transaction identifiers with new transaction identifiers; wherein different modified transaction requests are associated with now transaction identifiers that have different values.

Stage 440 may be followed by stage 450 of sending, by the interfacing entity, the modified transaction requests to an interconnect that is coupled to a processor; wherein the interconnect is arranged to prevent pipelining of transaction requests that have new transaction identifiers of a same value.

Stage 450 may be followed by stage 460 of managing the modified transaction requests.

Stage 460 may includes receiving transaction responses to the modified transactions requests.

Stage 460 may include generating, by the interconnect, multiple snoop transactions that are associated with the new transaction identifiers and receiving by the interconnect multiple snoop responses to the snoop transaction. Each snoop response indicates whether a transaction request should be targeted to the processor or to a dynamic random access memory (DRAM) module coupled to the interconnect.

Stage 460 may be followed by stage 480 of responding to the transaction responses while maintaining an order of arrival of the multiple transaction requests.

According to an embodiment of the invention the multiple transaction requests are read requests, the modified transaction requests are modified read requests, the transaction responses include data units read from either one of a cache of the processor and a DRAM module coupled to the interconnect and the responding (480) comprises outputting the data units according to an order of arrival of the multiple read requests. This can be performed by storing information relating to the order of arrival of the different transaction requests (such as the order in which the new sequence identifiers were generated) and buffering each data unit until at least all the data units that are associated with older transaction requests have been outputted to the I/O masters). A re-ordering buffer can be used in this instance.

According to another embodiment of the invention the multiple transaction requests are write requests, the modified transaction requests are modified write requests and the responding (480) includes participating in writing (to either one of a cache of the processor and a DRAM module coupled to the interconnect) data units associated with the multiple write requests according to an order of arrival of the multiple write requests.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections und vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method comprising:
receiving, by an interfacing module, multiple transaction requests related to multiple data units, wherein the multiple transaction requests are associated with transaction identifiers of a same value;
generating modified transaction requests by replacing the transaction identifiers with new transaction identifiers, wherein different modified transaction requests have new transaction identifiers of different values;
sending the modified transaction requests to an interconnect, wherein the interconnect generates multiple snoop transactions associated with the new transaction identifiers, and receives multiple snoop responses to the multiple snoop transactions, wherein the multiple snoop responses include a first snoop response indicating a first target of a first transaction request is a cache of a processor, and a second snoop response indicating a second target of a second transaction request is a memory module coupled to the interconnect;
receiving transaction responses to the modified transaction requests; and
responding to the transaction responses while maintaining an order of arrival of the multiple transaction requests.

2. The method according to claim 1, wherein the interconnect includes anti-pipelining logic that prevents pipelining of transaction requests having transaction identifiers of the same value.

3. The method according to claim 1, further comprising:
storing information relating to the order of arrival of the multiple transaction requests.

4. The method according to claim 1, wherein the multiple transaction requests are read requests, and the modified transaction requests are modified read requests.

5. The method according to claim 4, wherein the transaction responses include data units read from the memory module coupled to the interfacing module, and responding to the transaction responses includes outputting the data units according to the order of arrival of the multiple transaction requests.

6. The method according to claim 1, wherein the multiple transaction requests are write requests, and the modified transaction requests are modified write requests.

7. The method according to claim 6, wherein the modified write requests write data units to the cache of the processor or the memory module coupled to the interconnect, and the transaction responses are returned according to the order of arrival of the multiple transaction requests.

8. A system comprising:
an interfacing module that includes:
an input output (I/O) circuit; and
a transaction request processor that is coupled to the I/O circuit,
wherein the transaction request processor is arranged to receive from the I/O circuit multiple transaction requests related to multiple data units, the multiple transaction requests being associated with transaction identifiers of a same value, and wherein the transaction request processor is further arranged to generate modified transaction requests by replacing the transaction identifiers with new transaction identifiers, the modified transaction requests being associated with new transaction identifiers that have different values,
wherein the I/O circuit is arranged to send the modified transaction requests to an interconnect that is coupled to a processor, and receive transaction responses to the modified transactions requests,
wherein the interconnect is arranged to generate multiple snoop transactions associated with the new transaction identifiers, and receive multiple snoop responses to the multiple snoop transactions including a first snoop response indicating a first target of a first transaction request is a cache of the processor, and a second snoop response indicating a second target of a second transaction request is a memory module coupled to the interconnect, and wherein the transaction request processor is further arranged to respond to the transaction responses while maintaining an order of arrival of the multiple transaction requests.

9. The system according to claim 8, wherein the interconnect includes anti-pipelining logic that prevents pipelining of transaction requests having transaction identifiers of the same value.

10. The system according to claim 8, wherein the transaction request processor is further arranged to store information relating to the order of arrival of the multiple transaction requests.

11. The system according to claim 8, wherein the multiple transaction requests are read requests, and the modified transaction requests are modified read requests.

12. The system according to claim 11, wherein the transaction responses include data units read from the memory module coupled to the interfacing module, and responding to the transaction responses includes outputting the data units according to the order of arrival of the multiple transaction requests.

13. The system according to claim 8, wherein the multiple transaction requests are write requests, and the modified transaction requests are modified write requests.

14. The system according to claim 13, wherein the modified write requests write data units to the cache of the processor or the memory module coupled to the interconnect, and the transaction responses are returned according to the order of arrival of the multiple transaction requests.

15. A semiconductor device, comprising:
an interfacing module that includes:
an input output (I/O) circuit; and
a transaction request processor that is coupled to the I/O circuit,
wherein the transaction request processor is arranged to receive from the I/O circuit multiple transaction requests related to multiple data units, the multiple transaction requests being associated with transaction identifiers of a same value, and wherein the transaction request processor is further arranged to generate modified transaction requests by replacing the transaction identifiers with new transaction identifiers, the modified transaction requests being associated with new transaction identifiers that have different values,
wherein the I/O circuit is arranged to send the modified transaction requests to an interconnect that is coupled to a processor, and receive transaction responses to the modified transactions requests,
wherein the interconnect is arranged to generate multiple snoop transactions associated with the new transaction identifiers, and receive multiple snoop responses to the multiple snoop transactions including a first snoop response indicating a first target of a first transaction request is a cache of the processor, and a second snoop response indicating a second target of a second transaction request is a memory module coupled to the interconnect, and
wherein the transaction request processor is further arranged to respond to the transaction responses while maintaining an order of arrival of the multiple transaction requests.

16. The semiconductor device according to claim 15, wherein the interconnect includes anti-pipelining logic that prevents pipelining of transaction requests having transaction identifiers of the same value.

17. The semiconductor device according to claim 15, wherein the transaction request processor is further arranged to store information relating to the order of arrival of the multiple transaction requests.

18. The semiconductor device according to claim 15, wherein the multiple transaction requests are read requests, and the modified transaction requests are modified read requests.

19. The semiconductor device according to claim 15, wherein the multiple transaction requests are write requests, and the modified transaction requests are modified write requests.

* * * * *